United States Patent
Berkovich et al.

(10) Patent No.: US 11,035,915 B2
(45) Date of Patent: Jun. 15, 2021

(54) METHOD AND SYSTEM FOR MAGNETIC FINGERPRINTING

(71) Applicant: InvenSense, Inc., San Jose, CA (US)

(72) Inventors: Gennadii Berkovich, Calgary (CA); Dmitry Churikov, Calgary (CA)

(73) Assignee: InvenSense, Inc., San Jose, CA (US)

(*) Notice: Subject to any disclaimer, the term of this patent is extended or adjusted under 35 U.S.C. 154(b) by 327 days.

(21) Appl. No.: 16/146,257

(22) Filed: Sep. 28, 2018

(65) Prior Publication Data
US 2020/0103477 A1 Apr. 2, 2020

(51) Int. Cl.
*G01R 33/10* (2006.01)
*G01R 33/00* (2006.01)
*H04M 1/02* (2006.01)

(52) U.S. Cl.
CPC ......... *G01R 33/10* (2013.01); *G01R 33/0023* (2013.01); *H04M 1/0202* (2013.01); *H04M 2250/12* (2013.01)

(58) Field of Classification Search
CPC ..... G01R 33/10; G01R 33/0023; H04M 1/12; H04M 1/0202
USPC .......................................................... 702/57
See application file for complete search history.

(56) References Cited

U.S. PATENT DOCUMENTS

| | | | | |
|---|---|---|---|---|
| 8,250,921 B2* | 8/2012 | Nasiri | ................... | G01P 15/125 73/511 |
| 8,952,832 B2* | 2/2015 | Nasiri | ..................... | G01P 15/02 341/20 |
| 2014/0171118 A1* | 6/2014 | Marti | .................... | H04W 4/021 455/456.3 |
| 2014/0335893 A1* | 11/2014 | Ronen | .................. | H04W 64/00 455/456.1 |
| 2017/0176191 A1* | 6/2017 | Li | .......................... | G01S 19/01 |
| 2017/0219359 A1* | 8/2017 | Elhoushi | ............. | G01C 21/206 |
| 2018/0112983 A1* | 4/2018 | Ahmed | ................ | G01C 21/005 |
| 2018/0356475 A1* | 12/2018 | Eitel | .................. | G01R 33/0206 |
| 2019/0170521 A1* | 6/2019 | Elhoushi | ............... | G01C 21/34 |
| 2020/0142008 A1* | 5/2020 | Berkovich | ......... | G01R 33/0035 |

OTHER PUBLICATIONS

Art Kay, "Operational Amplifier Noise", 2012. (Year: 2012).*

\* cited by examiner

*Primary Examiner* — Michael P Nghiem
(74) *Attorney, Agent, or Firm* — Bay Area Technology Law Group PC

(57) ABSTRACT

Systems and methods are disclosed for generating a magnetic fingerprint map. Information representing orientation and position of each portable device is obtained along with magnetic field measurements that are correlated with positions determined from the information. Uncertainties associated with the magnetic field measurements are estimated and the magnetic field measurements and associated uncertainties are converted from a device frame to a unified fingerprint frame using the orientations determined from the information. Parameters of a probability distribution function for magnetic field measurements and contaminating measurements are mitigated at each determined position based at least in part on the converted magnetic field measurements and associated uncertainties. Correspondingly, the magnetic fingerprint map is generated from the determined parameters of the probability distribution functions.

20 Claims, 8 Drawing Sheets

METHOD AND SYSTEM FOR MAGNETIC FINGERPRINTING

FIELD OF THE PRESENT DISCLOSURE

This disclosure generally relates to techniques for determining the position of a portable device and more particularly to improving accuracy when obtaining patterns of magnetic signals that may be correlated with magnetic patterns in known positions for use in determining position.

BACKGROUND

Particularly in the context of mobile or portable electronic devices, it is desirable to provide location awareness capabilities. An expanding variety of technologies have been developed to provide a device with information about its location, allowing it to selectively deliver information based on its location context or to otherwise adapt its operation. Common examples include navigation aids that may be used to guide a user to a desired destination, dispatch of emergency services, social networking applications that may inform the user about others that may be in proximity, targeted advertising schemes that may provide information relative to the user's location or tracking utilities that may provide real time information about a user's whereabouts.

In some cases, a portable device may have position determination capabilities in the form of a Global Navigation Satellite System (GNSS) that, under the proper conditions, may provide precise information about the geographic location of the device. However, GNSS performance may be subject to degradation when visibility of the satellites is reduced. For example, use of GNSS in an indoor environment may lengthen the time needed to obtain the necessary fix on the satellites or may prevent it entirely. Common alternatives or supplements to GNSS include self-contained motion sensors, such as low cost Micro Electro-Mechanical Systems (MEMS) inertial sensors, barometers and magnetometers. Reference-based techniques, such as GNSS, and self-contained sensors can be integrated to provide promising positioning results in most outdoor environments. However, some mass market applications require seamless positioning capabilities in all kinds of environments such as malls, offices or underground parking lots. In the absence of GNSS signals in indoor environments, an Inertial Navigation System (INS) may be used by employing techniques such as dead reckoning to help determine position. Nevertheless, sensor-based techniques may fail to provide adequate performance by themselves, particularly over longer durations due to significant performance degradation from accumulating sensor drifts and bias. As such, positioning technologies relying solely on motion sensors may not satisfy all requirements for seamless indoor and outdoor navigation applications. As a result, alternative positioning techniques that can provide strong coverage in areas where access to other reference-based positioning is degraded or denied have been developed.

One class of techniques is known as "fingerprinting," and relies on recording patterns of electromagnetic wireless signals at known locations within an area for which position information may be desired. When a device subsequently measures a pattern of received signals that is correlated with a known location, that location may be used to determine the position of the device and/or to aid another positioning technique, such as through integration with the INS techniques noted above. With particular regard to this disclosure, environmental signals in the form of magnetic fields may be used as the basis for creating a fingerprint map. Magnetic fingerprint-based positioning offers a number of compelling advantages because it is infrastructure-free and benefits from the long-term stability of magnetic fields inside a building.

As noted, a fingerprint database must be built to correlate magnetic signal patterns with known locations. Unfortunately, building these databases is a time-consuming and resource-intensive procedure. Generally, one or more surveys are performed so that magnetometer readings are collected at desired positions inside a building at a useful resolution, such as by taking readings at locations separated by a given distance, for example, 1 or 2 meters, and then estimating the magnetic field patterns in those positions by processing magnetometer readings. Such systematic surveys of magnetic fields in a building may be performed by moving along predetermined routes with portable devices to record the measurements. One approach to collecting the necessary magnetic data that seeks to reduce or eliminate the need for dedicated surveys is based on use of everyday activity of a plurality of persons inside a building undergoing normal behavior, such as shopping in a retail mall or progressing between gates and other locations in an airport. Given the widespread adoption of capable portable devices, such as smart phones, a suitable device associated with each person may passively record multiple magnetic field measurements without requiring any change in behavior. These methods are typically known as crowdsourcing and represent an opportunity to acquire the necessary data without performing special surveys of the building.

However, regardless of whether the necessary magnetic field data is acquired through dedicated surveys, through crowdsourcing or through a combination of these or other techniques, errors of various types may affect the accuracy of the resulting fingerprint map. For example, errors may result from associating an incorrect position with a given measurement. In the context of a retail environment, the location of the portable device may be taken to be in one aisle, when in fact the actual position may be the adjacent aisle. Thus, even though the measurement may itself may be accurate, it may incorrectly be associated with the wrong location. Since the orientation of the device may also affect the measurement, errors can result from an inaccurate estimation of the orientation of the portable device or an inaccurate estimation of the misalignment angle between the device and its conveying platform, such as the user of the portable device. Still further, errors may result from inaccurate magnetometer calibration or other factors. Any of the noted errors or other conditions may result in magnetic field measurements that have the potential to contaminate the magnetic fingerprint map.

Thus, these and other errors may undesirably degrade accuracy when building the magnetic fingerprint map. Conventional techniques for mitigating these contaminating measurements may involve a two-step approach. First, an attempt may be made to detect and reject contaminating magnetic measurements by applying a suitable validation procedure. Next, the magnetic field for a given location is then estimated by applying some averaging procedure to magnetic measurements that remained after applying the validation procedure. As will be appreciated, this strategy does not sufficiently compensate for errors associated with determining an incorrect position or orientation of the recording portable device, and these errors will not be corrected. Another drawback is that magnetic measurements may be distorted by applying the validation procedure, so that averaging of magnetic measurements no longer provides effective estimation of magnetic field.

Accordingly, the techniques of this disclosure represent a more accurate compensation for contaminating magnetometer measurements to generate a more useful magnetic fingerprint map as described in the following materials.

SUMMARY

This disclosure includes a method for generating a magnetic fingerprint map. Information representing orientation and position and sensor data comprising magnetic field measurements is obtained for each of a plurality of portable devices. A position and orientation is determined for each portable device based at least in part on the information representing orientation and position. Magnetic field measurements from each portable device are correlated with each determined position. Uncertainties associated with the magnetic field measurements are estimated and the magnetic field measurements and associated uncertainties are converted from a device frame to a unified fingerprint frame, based at least in part on the determined orientations. Parameters of a probability distribution function for magnetic field measurements are determined and contaminating measurements may be mitigated based at least in part on the converted magnetic field measurements and associated uncertainties and the magnetic fingerprint map is generated using the determined parameters of the probability distribution functions for magnetic field measurements at each determined position.

The disclosure also includes a system for generating a magnetic fingerprint map. The system has a plurality of portable devices, wherein each portable device provides information representing position and orientation of that portable device and wherein each portable device provides sensor data comprising magnetic field measurements. The system also has remote processing resources configured to receive the information and sensor data from each portable device and to implement a fingerprinting mapping module to determine parameters of a probability distribution function for magnetic field measurements and mitigate contaminating measurements at each of multiple determined positions based at least in part on converted magnetic field measurements and associated uncertainties. A position and orientation of each portable device is determined based at least in part on the information. Magnetic field measurements are correlated with each determined position for each portable device, such that multiple magnetic field measurements are correlated with multiple determined positions. Uncertainties associated with the magnetic field measurements are estimated, so that the magnetic field measurements and associated uncertainties are converted from a device frame to a unified fingerprint frame, based at least in part on the determined orientations. The fingerprinting mapping module then may generate a magnetic fingerprint map, based at least in part on the determined parameters of the probability distribution functions for magnetic field measurements at the multiple determined positions.

This disclosure also includes a server having a processor configured to implement a fingerprint mapping module to determine parameters of a probability distribution function for magnetic field measurements at each of multiple determined positions based at least in part on converted correlated magnetic field measurements and converted magnetic field measurement uncertainties, wherein the magnetic field measurements are obtained from a plurality of portable devices and wherein each portable device provides information representing position and orientation of that portable device. A position and orientation of each portable device is determined based at least in part on the information. Magnetic field measurements are correlated with each determined position for each portable device, such that multiple magnetic field measurements are correlated with multiple determined positions. Uncertainties associated with the magnetic field measurements are estimated so that the magnetic field measurements and associated uncertainties may be converted from a device frame to a unified fingerprint frame, based at least in part on the determined orientations. The fingerprint mapping module may then generate a magnetic fingerprint map based at least in part on the determined parameters of the probability distribution functions for magnetic field measurements at the multiple determined positions.

DETAILED DESCRIPTION

Figure 1:
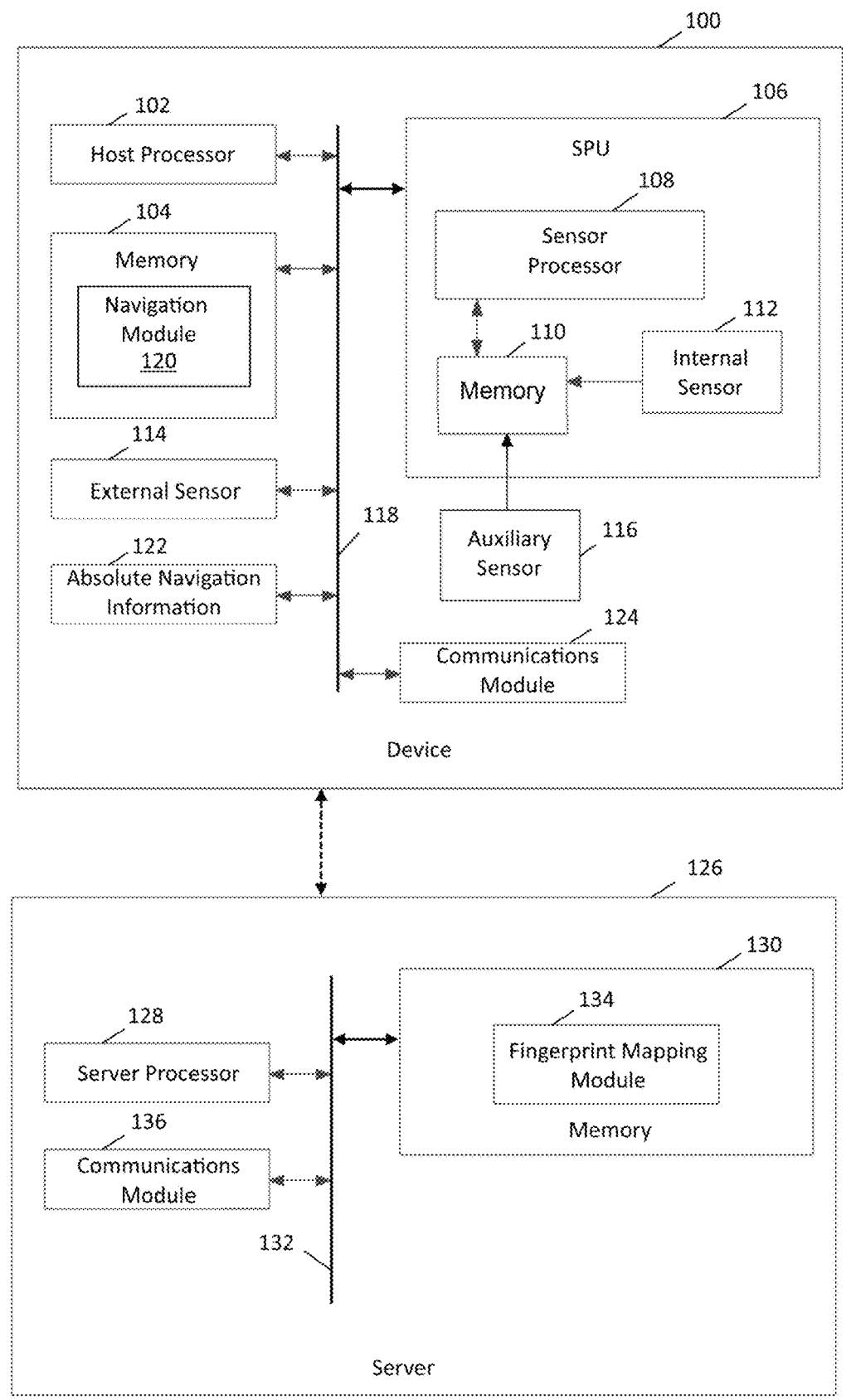
FIG. 1 is a schematic diagram of fingerprint mapping system according to an embodiment.

At the outset, it is to be understood that this disclosure is not limited to particularly exemplified materials, architectures, routines, methods or structures as such may vary. Thus, although a number of such options, similar or equivalent to those described herein, can be used in the practice or embodiments of this disclosure, the preferred materials and methods are described herein.

It is also to be understood that the terminology used herein is for the purpose of describing particular embodiments of this disclosure only and is not intended to be limiting.

The detailed description set forth below in connection with the appended drawings is intended as a description of exemplary embodiments of the present disclosure and is not intended to represent the only exemplary embodiments in which the present disclosure can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the specification. It will be apparent to those skilled in the art that the exemplary embodiments of the specification may be practiced without these specific details. In some instances, well known structures and devices are shown in block diagram form in order to avoid obscuring the novelty of the exemplary embodiments presented herein.

For purposes of convenience and clarity only, directional terms, such as top, bottom, left, right, up, down, over, above, below, beneath, rear, back, and front, may be used with respect to the accompanying drawings or chip embodiments. These and similar directional terms should not be construed to limit the scope of the disclosure in any manner.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and converts data represented as physical (electronic) quantities within the computer system's registers and memories into other data similarly represented as physical quantities within the computer system memories or registers or other such information storage, transmission or display devices.

Embodiments described herein may be discussed in the general context of processor-executable instructions residing on some form of non-transitory processor-readable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the exemplary wireless communications devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium comprising instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor. For example, a carrier wave may be employed to carry computer-readable electronic data such as those used in transmitting and receiving electronic mail or in accessing a network such as the Internet or a local area network (LAN). Of course, many modifications may be made to this configuration without departing from the scope or spirit of the claimed subject matter.

The various illustrative logical blocks, modules, circuits and instructions described in connection with the embodiments disclosed herein may be executed by one or more processors, such as one or more motion processing units (MPUs), sensor processing units (SPUs), digital signal processors (DSPs), general purpose microprocessors, application specific integrated circuits (ASICs), application specific instruction set processors (ASIPs), field programmable gate arrays (FPGAs), or other equivalent integrated or discrete logic circuitry. The term "processor," as used herein may refer to any of the foregoing structure or any other structure suitable for implementation of the techniques described herein. In addition, in some aspects, the functionality described herein may be provided within dedicated software modules or hardware modules configured as described herein. Also, the techniques could be fully implemented in one or more circuits or logic elements. A general purpose processor may be a microprocessor, but in the alternative, the processor may be any conventional processor, controller, microcontroller, or state machine. A processor may also be implemented as a combination of computing devices, e.g., a combination of an SPU and a microprocessor, a plurality of microprocessors, one or more microprocessors in conjunction with an SPU core, or any other such configuration.

Unless defined otherwise, all technical and scientific terms used herein have the same meaning as commonly understood by one having ordinary skill in the art to which the disclosure pertains.

Finally, as used in this specification and the appended claims, the singular forms "a, "an" and "the" include plural referents unless the content clearly dictates otherwise.

To help illustrate these aspects, a representative portable device for use in obtaining magnetic field measurements that may be used when building a fingerprint map is schematically depicted in FIG. 1, with device 100 represented by high level schematic blocks. As will be appreciated, device 100 may be implemented as a device or apparatus, such as a handheld device that can be moved in space by a user and its motion, location and/or orientation in space therefore sensed. For example, such a handheld device may be a mobile phone (e.g., smartphone, cellular phone, a phone running on a local network, or any other telephone handset), tablet, personal digital assistant (PDA), video game player, video game controller, navigation device, wearable device (e.g., glasses, watch, belt clip), fitness tracker, virtual or augmented reality equipment, mobile internet device (MID), personal navigation device (PND), digital still camera, digital video camera, binoculars, telephoto lens, portable music, video or media player, remote control, or other handheld device, or a combination of one or more of these devices. Such devices may be associated with a platform that conveys the device. The platform may be a human user, as in the example of a smartphone being carried. The platform may also be considered a vehicle or vessel that conveys the device. Alternatively, the platform itself may be automated and may convey the device without the need for a human operator. Still further, the device may be dedicated to the function of surveying and in some embodiments may be capable of automated motion on its own without a separate platform. Accordingly, the dedicated device may be propelled or guided by a human surveyor or may be automated, such as in the form of a robot or drone.

Although the device may be transported or conveyed in the direction of movement of the platform depending on the embodiment, its orientation may not be constrained. Returning to the example of the smartphone, it may be held in the user's hand and employed in a variety of orientations or carried in a pocket, holster, bag or other manners. In other examples, the device may be strapped to the platform, such as with a vehicle mount, or may be non-strapped. When non-strapped, the mobility of the device may be constrained or unconstrained within the platform and as a result, circumstances may exist such that the device can be tilted to any orientation with respect to the user or platform.

As shown, device 100 includes a host processor 102, which may be one or more microprocessors, central processing units (CPUs), or other processors to run software programs, which may be stored in memory 104, associated with the functions of device 100. Multiple layers of software can be provided in memory 104, which may be any combination of computer readable medium such as electronic memory or other storage medium such as hard disk, optical disk, etc., for use with the host processor 102. For example, an operating system layer can be provided for device 100 to control and manage system resources in real time, enable functions of application software and other layers, and interface application programs with other software and functions of device 100. Similarly, different software application programs such as menu navigation software, games, camera function control, navigation software, communications software, such as telephony or wireless local area network (WLAN) software, or any of a wide variety of other software and functional interfaces can be provided. In some embodiments, multiple different applications can be provided on a single device 100, and in some of those embodiments, multiple applications can run simultaneously.

Device 100 includes at least one sensor assembly, as shown here in the form of integrated motion processing unit (MPU) or sensor processing unit (SPU) 106 featuring sensor processor 108, memory 110 and internal sensor 112. The various component of SPU 106 may also use a bus-like architecture for communication. Memory 110 may store algorithms, routines or other instructions for processing data output by internal sensor 112 and/or other sensors as described below using logic or controllers of sensor processor 108, as well as storing raw data and/or motion data output by internal sensor 112 or other sensors. Internal sensor 112 may be one or more sensors for measuring motion of device 100 in space as described below, including inertial sensors. Depending on the configuration, SPU 106 measures one or more axes of rotation and/or one or more axes of acceleration of the device. In one embodiment, internal sensor 112 may include rotational motion sensors or linear motion sensors. For example, the rotational motion sensors may be gyroscopes to measure angular velocity along one or more orthogonal axes and the linear motion sensors may be accelerometers to measure specific forces along one or more orthogonal axes. In one aspect, three gyroscopes and three accelerometers may be employed, such that a sensor fusion operation performed by sensor processor 108, or other processing resources of device 100, combines data from internal sensor 112 to provide a six axis determination of motion. As desired, internal sensor 112 may be implemented using Micro Electro Mechanical System (MEMS) to be integrated with SPU 106 in a single package. In some embodiments, internal sensor 112 may also include a magnetometer that measures along three orthogonal axes which, in addition to collecting magnetic field measurements for the fingerprint map, may provide output data to be fused with the gyroscope and accelerometer inertial sensor data to provide a nine axis determination of motion. Exemplary details regarding suitable configurations of host processor 102 and SPU 106 may be found in co-pending, commonly owned U.S. Pat. No. 8,250,921 issued Aug. 28, 2012, and U.S. Pat. No. 8,952,832 issued Feb. 10, 2015, which are hereby incorporated by reference in their entirety. Suitable implementations for SPU 106 in device 100 are available from InvenSense, Inc. of San Jose, Calif.

Alternatively or in addition, device 100 may implement a sensor assembly in the form of external sensor 114. The external sensor may represent one or more sensors as described above, such as an accelerometer and/or a gyroscope, which output data for use in deriving a position. As used herein, "external" means a sensor that is not integrated with SPU 106. Also alternatively or in addition, SPU 106 may receive data from an auxiliary sensor 116 configured to measure one or more aspects about the environment surrounding device 100 and may be integrated with the SPU. At least one of external sensor 114 and auxiliary sensor 116 includes a magnetometer if one is not provided in the form of internal sensor 112 or optionally may include a supplemental magnetometer. As desired, either external sensor 114 or auxiliary sensor 116 (or internal sensor 112) may also include a barometer to provide an altitude determination that may be fused with the other sensor data to provide a ten axis determination of motion. Although described in the context of one or more sensors being MEMS based, the techniques of this disclosure may be applied to any sensor design or implementation.

In the embodiment shown, host processor 102, memory 104, SPU 106 and other components of device 100 may be coupled through bus 118, which may be any suitable bus or interface, such as a peripheral component interconnect express (PCIe) bus, a universal serial bus (USB), a universal asynchronous receiver/transmitter (UART) serial bus, a suitable advanced microcontroller bus architecture (AMBA) interface, an Inter-Integrated Circuit (I2C) bus, a serial digital input output (SDIO) bus, a serial peripheral interface (SPI) or other equivalent. Depending on the architecture, different bus configurations may be employed as desired. For example, additional buses may be used to couple the various components of device 100, such as by using a dedicated bus between host processor 102 and memory 104.

In one aspect, the various operations of this disclosure used to derive a navigation solution comprising at least the position and orientation for device 100 as the magnetic measurement are collected may be implemented through navigation module 120 as a set of suitable instructions stored in memory 104 that may be read and executed by host processor 102. The navigation solution may include any suitable information related to the position, motion and/or orientation of portable device 100. Although discussed primarily in the context of dead reckoning, which may be considered a self-contained strategy, navigation module 120 may employ a reference-based strategy, another self-contained strategy, or any combination of strategies to provide any desired degree of location awareness capabilities. For example, navigation module 120 may employ inertial navigation techniques utilizing sensor data, such as from internal sensor 112 and/or external sensor 114, as obtained for a current sensor epoch to derive a navigation solution for that epoch.

Optionally, navigation module 120 may also use a source of absolute navigation information 122 for use with a reference-based strategy, such as a Global Navigation Satellite System (GNSS) receiver, including without limitation the Global Positioning System (GPS), the Global Navigation Satellite System (GLONASS), Galileo and/or Beidou, as well as WiFi™ positioning, cellular tower positioning, Bluetooth™ positioning beacons or other similar methods when deriving a navigation solution. This is optional and not required in all embodiments. Navigation module 120 may also be configured to use information from a wireless communication protocol to provide a navigation solution determination using signal trilateration. Any suitable protocol, including cellular-based and wireless local area network (WLAN) technologies such as Universal Terrestrial Radio Access (UTRA), Code Division Multiple Access (CDMA) networks, Global System for Mobile Communications (GSM), the Institute of Electrical and Electronics Engineers (IEEE) 802.16 (WiMAX), Long Term Evolution (LTE), IEEE 802.11 (WiFi™) and others may be employed. Further, device 100 typically includes a communications module 124 for transmitting and/or receiving information, including the positions and orientations derived by navigation module 120 as well as the corresponding magnetic field measurements.

Multiple layers of software may be employed as desired and stored in any combination of memory 104, memory 110, or other suitable location. For example, a motion algorithm layer can provide motion algorithms that provide lower-level processing for raw sensor data provided from the motion sensors and other sensors. A sensor device driver layer may provide a software interface to the hardware sensors of device 100. Further, a suitable application program interface (API) may be provided to facilitate communication between host processor 102 and SPU 106, for example, to transmit desired sensor processing tasks.

In this exemplary system, device 100 communicates sensor data, including the magnetic signals being recorded, and/or navigation solutions derived to server 126. In some embodiments as noted above, device 100 determines navigation solutions in real-time as a user moves through an environment with device 100. Alternatively, only raw sensor data may be sent to server 126, which may derive the positions of device 100 and correlate them with the recorded wireless signals. When the position determinations are performed by server 126, they may also be derived in real-time, given any communication delay, or may be performed at a subsequent time. One suitable architecture of server 126 is depicted using high level schematic blocks in FIG. 1, and may include server processor 128 that is in communication with memory 130 over bus 132. As will be described in further detail below, server processor 128 may execute instructions stored in memory 130, including those represented by fingerprint mapping module 134. Server 126 may also include a communications module 136 to receive raw sensor data or navigation solutions for device 100 derived by navigation module 120. Communications between device 100 and server 126 may employ any suitable protocol. For example, a shorter range, low power communication protocol such as BLUETOOTH®, ZigBee®, ANT or a wired connection may be used or a longer range communication protocol, such as a transmission control protocol, internet protocol (TCP/IP) packet-based communication, accessed using a wireless local area network (WLAN), cell phone protocol or the like may be used. In general, the system depicted in FIG. 1 may embody aspects of a networked or distributed computing environment. Device 100 and server 126 may communicate either directly or indirectly, such as through multiple interconnected networks. As will be appreciated, a variety of systems, components, and network configurations, topologies and infrastructures, such as client/server, peer-to-peer, or hybrid architectures, may be employed to support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the techniques as described in various embodiments.

Any or all of the functions described with respect to device 100 and server 126 may be performed by any number of discrete devices in communication with each other, or may be performed by device 100 itself in other suitable system architectures. Accordingly, it should be appreciated that any suitable division of processing resources may be employed whether within one device or among a plurality of devices. Further, aspects implemented in software may include but are not limited to, application software, firmware, resident software, microcode, etc., and may take the form of a computer program product accessible from a computer-usable or computer-readable medium providing program code for use by or in connection with a computer or any instruction execution system, such as host processor 102, sensor processor 108, server processor 128, a dedicated processor or any other processing resources of device 100, server 126 or other remote processing resources, or may be implemented using any desired combination of software, hardware and firmware.

As noted previously, magnetic fingerprinting provides an opportunity for determining position information for a portable device with high accuracy in challenging environments, including indoor locations. Accordingly, a significant factor in the successful implementation of such techniques is the quality of the fingerprint map. Aspects of this disclosure relate to compensating for or mitigating contaminating measurements used to construct the map, such as erroneous measurements. To help illustrate the potential for degraded accuracy due to contaminating measurements, FIG. 2 graphically depicts measurements taken at a correct position in comparison with measurements taken at an incorrect position. Specifically, the graph plots measurements of the magnetic field along the Z-axis as collected from multiple users, each with associated portable devices for a given location. The samples corresponding to measurements between approximately −40 and −30 µT were taken at the correct position, while the samples corresponding to measurements between approximately −20 and −15 µT were taken at an incorrect position. In turn, FIG. 3 is a histogram of this data showing the correct measurements clustered to the left and the incorrect measurements clustered to the right. A conventional averaging technique based on a Gaussian probability distribution function is represented by trace 300 and may be used to estimate the magnetic field measurements for this position. This curve demonstrates the effect of the contaminating (or otherwise erroneous) measurements on both the mean and variance as estimated by the probability density function averaging, as the mean value represented by the peak of trace 300 is shifted to the right more that by 5 µT, while the variance represented by the breadth of the curve is considerably increased.

The techniques of this disclosure mitigate the effect of such contaminating measurements by providing a one-step estimation of the magnetic field for a given location by applying a robust algorithm to the collected magnetic measurements to provide an improved estimation of the mean and standard deviation despite the presence of erroneous measurements. Indeed, the techniques of this disclosure are adapted for use with portable devices such as smartphones in which the magnetic measurements may be obtained at different orientations. To accommodate these characteristics, the magnetic field measurements collected by different devices, which correspondingly may be operating at different or random orientations, may be converted into a mutual, or unified, fingerprint frame that is generally fixed with respect to an external reference frame (e.g., the Earth), such as the floor plan of a venue or similar representation. Further, because the uncertainty of magnetic field measurements depend on the magnetic field measurements and any uncertainty of orientation angles, these magnetic field measurement uncertainties may also be estimated and converted to the mutual frame. Correspondingly, parameters of a probability distribution function for magnetic field measurements may be based, at least in part, on the converted magnetic field measurements and their associated uncertainties for use when generating a magnetic fingerprint map.

A magnetic fingerprint map functions to provide mapping between patterns of magnetic field measurements and known positions. For example, a magnetic fingerprint map can be considered as a database in which every record contains a 3D vector estimate of the magnetic field at defined positions. In addition, the database record may also contain other data, e.g. uncertainty of 3D magnetic field measurement and, as desired, other parameters. Positions can be defined in a certain coordinate frame further named as a fingerprint frame, e.g. local coordinate frame of the venue, global coordinate frame or another appropriate frame. Thus, a fingerprint map comprises a plurality of positions correlated with magnetic field parameters for those positions. The resolution of the fingerprint map may be adjusted by selecting the granularity at which positions of the portable devices are determined. For example, the positions with which the magnetic field measurements are correlated may be a grid or other configuration of points having a desired spacing, such as a few meters or less, overlaid on the traversable areas of the venue. In some embodiments, each of these points may include all the determined positions for the portable devices falling within a threshold distance.

Correspondingly, generating a magnetic fingerprint map according to the techniques of this disclosure include collecting magnetometer readings from a plurality of devices as well as device orientation data, uncertainty of the orientation data, and device position at the time of each measurement. As desired, uncertainty of position may also be used, such as by rejecting measurements associated a position that is considered to uncertain. The magnetic field measurements and the magnetic field measurement uncertainties may be converted to a common frame so that application of a robust estimation algorithm determines magnetic field parameters for the positions. As noted above, these operations may be employed to improve compensation for the presence of erroneous measurements.

Figure 4:
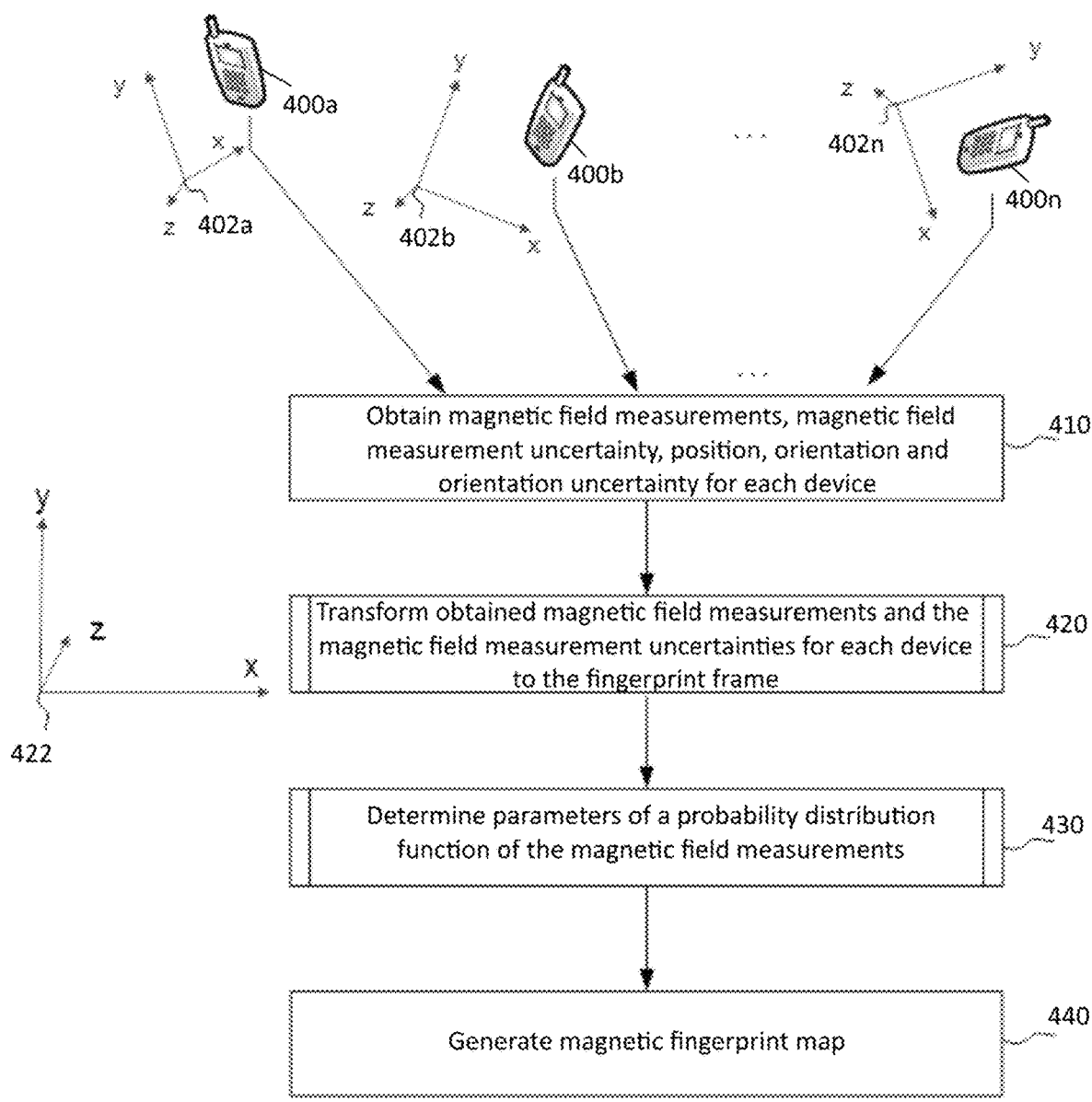
FIG. 4 is a flowchart showing a routine for generating a magnetic fingerprint map according to an embodiment.

To help illustrate these aspect, FIG. 4 is a schematic flowchart of representative operations that may be performed by fingerprint mapping module 134 or similar processing resource. As indicated, a plurality of portable devices 400*a*, 400*b* . . . 400*n* may be provide at various positions and orientations as indicated. Specifically, the frame of device 400*a* is schematically depicted by the orthogonal axes 402*a*, while devices 400*b* . . . 400*n* have frames 402*b* . . . 402*n*, respectively. In 410, magnetic field measurements, magnetic field measurement uncertainty, position, orientation and orientation uncertainty are obtained for each device. For example, portable devices 400*a*, 400*b* . . . 400*n* may have similar architectures as portable device 100 described above, such that the magnetic field measurements may be recorded by a magnetometer that is the equivalent of at least one of internal sensor 112, external sensor 114 or auxiliary sensor 116. The magnetometer may provide measurement of three components of magnetic field in each device's frame as indicated. Usually but not necessarily, the axes of a device frame may coincide with the physical dimensions of the device. Uncertainty of the magnetic field measurements may result from magnetometer noise, expressed as matrix $Q_k$ in the discussion below, and may be determined from the hardware specifications. Uncertainty may also be attributed to the biases of the magnetometer, express as matrix $\Sigma_k^b$ in the discussion below, and may be determined based on a calibration routine performed on the magnetometer that provides an estimate of magnetic biases. For example, a TWOSTEP algorithm as known in the art may be used to determine magnetic biases and estimate their uncertainty. Similarly, portable devices 400*a*, 400*b* . . . 400*n* may also include the equivalent of navigation module 120, that is able to leverage information from sensors of each device corresponding to internal sensor 112, external sensor 114 and/or auxiliary sensor 116 to determine position, orientation and orientation uncertainty for each device. Any suitable method may be used for obtaining such a data. As illustrations only and without limitation, device orientation angles can be determined by a Madgwick's algorithm and device position can be estimated by processing inertial sensors output by a dead reckoning (DR) or pedestrian dead reckoning (PDR) algorithm, or other similar techniques. Device orientation may be expressed as desired, including by using Euler angles, orientation quaternions or similar representations.

The noted information obtained in 410 may be collected by a suitable processing resource, such as server 126 described above, so that the information may be used by fingerprinting mapping module 134. Each device may transmit its respective information to server 126 via communication module 136. Correspondingly, server 126 may be implemented as a remote server, a cloud service or any other computational means. As previously discussed, different distributions of operations may be made between the respective devices and server 126. For example, one or more of the devices may communicate sensor data to server 126 for subsequent determination of position and/or orientation. Alternatively, the position and/or orientation may be determined by each device locally and then transmitted to server 126. Further, additional processing of the information may occur in server 126. As an illustration and without limitation, the received information may be filtered, such as by excluding data collected during temporary stops when it may be difficult to sufficient determine device orientation. Similarly, other the filtering may be based on other movement conditions or any suitable criteria. For example, it may be desirable to exclude data having an uncertainty above a given threshold may also be excluded. As an illustration, confidence in a position determined through PDR may degrade over time as a result of sensor drift or other factors.

Next, in 420 the obtained magnetic field measurements and the magnetic field measurement uncertainties for each device may be converted to a unified, fingerprint frame, schematically depicted by the axes 422. Again, the conversion may be performed locally at each device or remotely at server 126. As discussed above, the use of multiple portable devices, such as through crowdsourcing, may involve taking the magnetic field measurements with devices that are held in different orientations. Converting the measurements and their uncertainties to a common frame helps compensate for the differences. As an illustrative example, this disclosure includes the use of a 3D Cartesian coordinate system in which two axes lay in the horizontal plane and characterize position on a floor plan of a venue, while a vertical axis may characterize a height or a floor number. However, it will be appreciated that any other coordinate system may be used as desired, including a global geographical frame featuring latitude, longitude, and altitude. Besides converting magnetic data from a device frame to the fingerprint frame, fingerprint mapping module 134 may be configured to compute the uncertainty of every magnetic measurement in the fingerprint frame using orientation of a corresponding mobile device and other data at instant of measurement as noted above. An illustrative example of this operation is given in a subsequent section.

At this stage of the routine represented by FIG. 4, magnetic field measurements and their uncertainties, converted to the fingerprint frame, have been obtained from portable devices 400a, 400b . . . 400n and the quantities have been associated with positions where the measurements were taken. For the reasons discussed above, any given magnetic field measurement for a certain position is potentially corrupted by contaminating measurements. For example, a positioning error may cause measurements to be incorrectly associated with a location even though they would be accurate for the correct location. In some cases, the position uncertainty may be related to the granularity of the magnetic fingerprint map. Further, inaccuracies in the determined orientation of portable device obtaining the measurements may result in an erroneous conversion of the magnetic field measurements. Correspondingly, in 430 a robust algorithm may be performed to determine parameters of a probability distribution function of magnetic field measurements for any given position to account for potentially contaminating measurements using the uncertainties of individual magnetic field measurements in the fingerprint frame. Any suitable approach may be applied as desired, including using techniques such as maximum likelihood type estimates (or an M-estimate), order statistics, or rank-based tests. As used in this disclosure, such algorithms are termed as 'robust' because they allow estimation of parameters of a probability distribution function in presence of contaminating measurements. In one embodiment, the parameters of a probability distribution function of magnetic field measurements are a location and a scale of a probability distribution function, in which the location represents the most probable value indicated by the maxima of the function and the scale represents the variance of the distribution indicated by the breadth of the curve. For a normal distribution, the location corresponds to the mean and the scale to the standard deviation. Again, an illustrative example is given in a subsequent section.

Next, in 440 a magnetic fingerprint map may be created that comprises a plurality of positions associated with the determined parameters of the probability density function for the magnetic field measurements at each position. In one embodiment, the magnetic fingerprint map comprises locations and scales of a distribution of a 3D magnetic measurement vector associated with positions in the fingerprint frame. Similarly, each position can be represented in an appropriate coordinate system, for example in 3D Cartesian coordinate system two axes of which lay in the horizontal plane and characterize position on a floor plan of a venue and a vertical axis characterizes a height or a floor number as noted above. Further, the positions may be represented a global geographical frame featuring latitude, longitude, and altitude or using any other suitable frame of reference.

Figure 5:
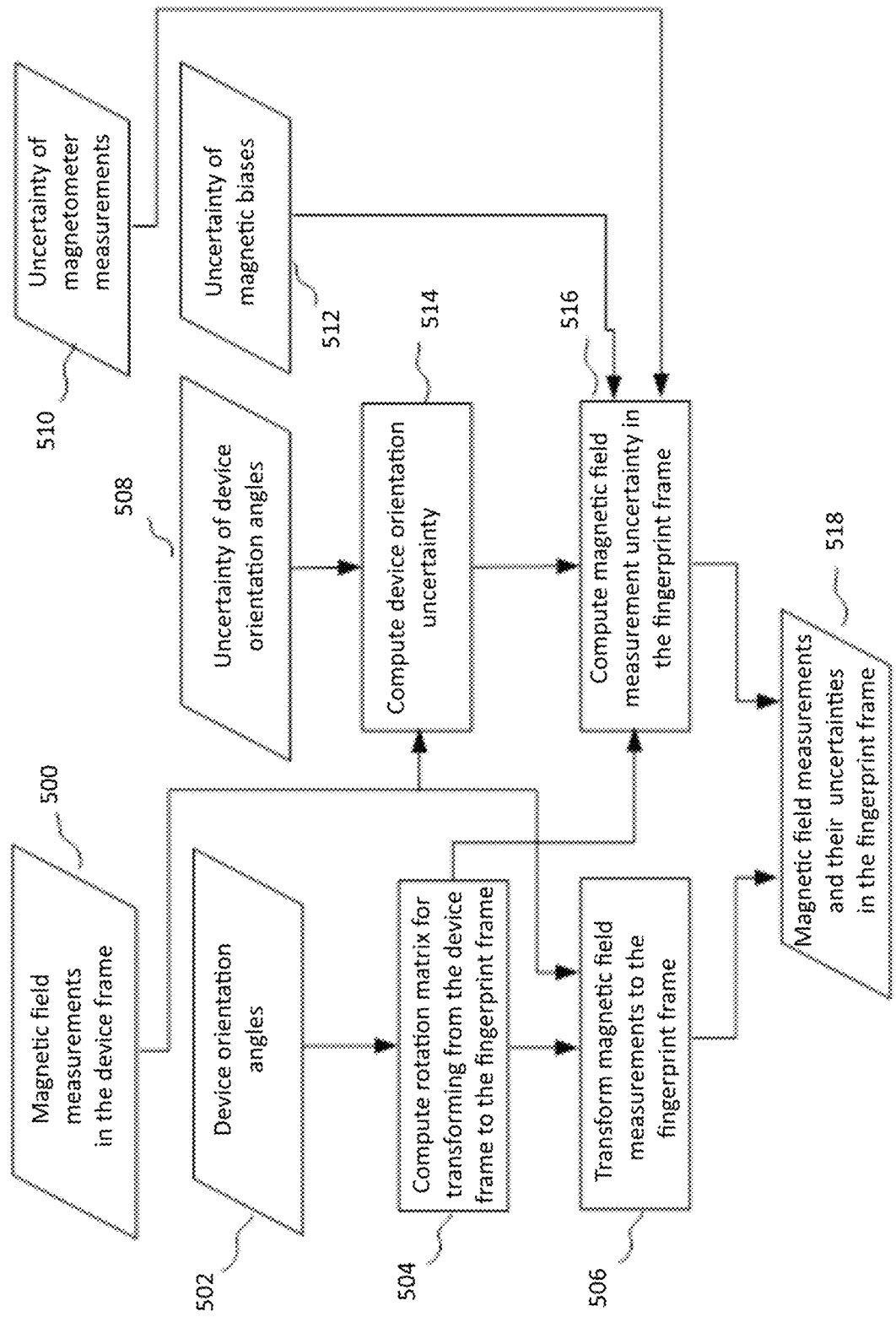
FIG. 5 is a flowchart showing a routine for converting magnetic field measurements and associated uncertainties to a fingerprint frame according to an embodiment.

Details regarding one suitable implementation for converting magnetic field measurements to the fingerprint frame and computing of the uncertainty of magnetic field measurements in the fingerprint frame are schematically illustrated in the flowchart of FIG. 5. The inputs represented by 500 are the magnetic field measurements in the frame of the device as recorded by its sensor a device frame, $m_{t,k}^x$, $m_{t,k}^y$, $m_{t,k}^z$, wherein x,y,z represent the three components of magnetometer output, t is the instant of measurement, and k is an index of the portable device recording the measurement. The input represented by 502 are the device orientation angles as obtained from the sensors of the portable device, wherein the roll angle is the rotation around the X axis, $\varphi_{t,k}$, the pitch angle is the rotation around the Y axis, $\theta_{t,k}$, and the heading (azimuth) angle is the rotation around the Z axis, $\psi_{t,k}$. The orientation angles may be used to compute a rotation matrix that functions to convert the device frame to the fingerprint frame as indicated by 504 and may be based on a sensor fusion operation on data from accelerometers, gyroscopes, magnetometers and/or others, such as from internal sensor 112, external sensor 114 or auxiliary sensor 116. Consequently, the magnetic field measurements in the device frame from 500 are converted by the rotation matrix in 506 to obtain the magnetic field measurements in the fingerprint frame.

In a parallel branch of the routine, the inputs of 508 are the uncertainties of device orientation angles, represented by the variance for the orientation angles noted above are $(\sigma_{t,k}^\varphi)^2$, $(\sigma_{t,k}^\theta)^2$, $(\sigma_{t,k}^\psi)^2$, the inputs of 510 are the uncertainties of the magnetometer filed measurements, represented by the variances $(\sigma_k^{mx})^2$, $(\sigma_k^{my})^2$, $(\sigma_k^{mz})^2$, and the inputs of 512 are the uncertainties of the magnetometer biases, represented by the covariance matrix $\Sigma_k^b$. As will be appreciated, uncertainty of device orientation angle may be derived from information such as the bias and/or sensitivity uncertainty of the inertial sensors, a characterization of the amount of motion experienced by device 100, the amount of time since a last stationary period, or any other suitable source. In 514, the orientation angle uncertainties from 508 and the magnetic field measurements in the device frame from 500 are used to compute magnetic field measurement uncertainties caused by errors in the determination of device orientation. Next, in 516, the magnetic field measurement uncertainties from 514, the other magnetic field measurement uncertainties from 510 (such as caused by position errors) and the magnetic bias uncertainties from 512 are converted to the fingerprint frame using the rotation matrix from 504. Thus, the output 518 of this routine are the magnetic measurements and their associated uncertainties in the fingerprint frame. As will be appreciated, part of this data is time-dependent and the rest may be considered to time-independent and differs for different portable devices.

Formation of the rotation matrix in 504 uses the orientation angles from 502 as indicated and may be represented by the rotation matrix $R_{t,k}$ as given in Equation (1):

$$R_{t,k} = \begin{bmatrix} \cos\theta_{t,k} & -\cos\varphi_{t,k}\sin\psi_{t,k} + & \sin\varphi_{t,k}\sin\psi_{t,k} + \\ \cos\psi_{t,k} & \sin\varphi_{t,k}\sin\theta_{t,k}\cos\psi_{t,k} & \cos\varphi_{t,k}\sin\theta_{t,k}\cos\psi_{t,k} \\ \cos\theta_{t,k} & \cos\varphi_{t,k}\cos\psi_{t,k} + & -\sin\varphi_{t,k}\cos\psi_{t,k} + \\ \sin\psi_{t,k} & \sin\varphi_{t,k}\sin\theta_{t,k}\sin\psi_{t,k} & \cos\varphi_{t,k}\sin\theta_{t,k}\sin\psi_{t,k} \\ -\sin\theta_{t,k} & \sin\varphi_{t,k}\cos\theta_{t,k} & \cos\varphi_{t,k}\cos\theta_{t,k} \end{bmatrix},$$

which is an illustration and presented without limitation, as other suitable conversion operations may be used as desired, such as those adapted for quaternions or Euler angles for example.

Thus, the magnetic field measurements may be converted in 504 to obtain the values in the fingerprint frame, $\vec{v}_{t,k}$, as indicated by Equation (2):

$$\vec{v}_{t,k} = \begin{bmatrix} v_{t,k}^x \\ v_{t,k}^y \\ v_{t,k}^z \end{bmatrix} = R_{t,k} \begin{bmatrix} m_{t,k}^x \\ m_{t,k}^y \\ m_{t,k}^z \end{bmatrix}$$

As a similar illustration without limitation of a suitable approach for deriving the uncertainties of the converted magnetic field measurements, the covariance of $\vec{v}_{t,k}$ may be expressed in terms of the uncertainties caused by erroneous device orientation angles, $P_{t,k}$, uncertainties of the magnetic field measurements, $Q_k$, and uncertainties of magnetometer biases, $\Sigma_k^b$, as indicated in Equation (3):

$$S_{t,k} = \text{cov}(\vec{v}_{t,k}) = R_{t,k}(P_{t,k} + Q_k \Sigma_k^b)R_{t,k}^T,$$

With simplification for small values of orientation angle variances, $P_{t,k}$ may be expressed according to Equation (4):

$$P_{t,k} = \begin{bmatrix} (\sigma_{t,k}^\psi m_{t,k}^y)^2 + (\sigma_{t,k}^\theta m_{t,k}^z)^2 & -(\sigma_{t,k}^\psi)^2 m_{t,k}^x m_{t,k}^y & -(\sigma_{t,k}^\theta)^2 m_{t,k}^x m_{t,k}^z \\ -(\sigma_{t,k}^\psi)^2 m_{t,k}^x m_{t,k}^y & (\sigma_{t,k}^\psi m_{t,k}^x)^2 + (\sigma_{t,k}^\varphi m_{t,k}^z)^2 & -(\sigma_{t,k}^\varphi)^2 m_{t,k}^y m_{t,k}^z \\ -(\sigma_{t,k}^\theta)^2 m_{t,k}^x m_{t,k}^z & -(\sigma_{t,k}^\varphi)^2 m_{t,k}^y m_{t,k}^z & (\sigma_{t,k}^\varphi m_{t,k}^y)^2 + (\sigma_{t,k}^\theta m_{t,k}^x)^2 \end{bmatrix}$$

It can be noticed that conversion of magnetometer measurements from a device frame to the mutual fingerprint frame creates additional errors (although not magnetometer noise and biases errors) caused by errors of orientation angles. Given that uncertainty $P_{t,k}$ depends on orientation angle uncertainties and magnetometer readings, the influence of $P_{t,k}$ on final uncertainty can dominate among other error sources and the techniques employed adapted to leverage this observation. Further, in this exemplary embodiment, the magnetic field measurements uncertainties $Q_k$ may be expressed using the diagonal matrix of Equation (5):

$$Q_k = \begin{bmatrix} (\sigma_k^{mx})^2 & 0 & 0 \\ 0 & (\sigma_k^{my})^2 & 0 \\ 0 & 0 & (\sigma_k^{mz})^2 \end{bmatrix}$$

Correspondingly, the above variables may be used in Equation (3) so that the output of 518 may be in terms of $\vec{v}_{t,k}$, the 3D vectors of magnetic field measurements in the fingerprint frame, and the associated uncertainty $S_{t,k}$ of each. Once more, the above implementation constitutes examples of suitable techniques but alternatives for one or more aspects may be employed as warranted. For example, uncertainty of magnetometer biases may be omitted or variances may be used rather than a covariance matrix (i.e. the matrix $\Sigma_k^b$ may be considered as diagonal), some input data that varies in time may be considered constant (e.g. orientation angle variances), variances (i.e., diagonal elements of covariance matrix $S_{t,k}$) may be used instead of the whole matrix, and/or other modifications, changes or additions as warranted.

As indicated above, a robust algorithm for determining probability density function parameters according to the techniques of this disclosure uses as inputs the 3D vectors of magnetic field measurements $\vec{v}_i$, i=1, . . . , n in the fingerprint frame and their uncertainties $S_i$, i=1, . . . , n for each position of the magnetic fingerprint map, such as may be obtained using the illustrative examples above or in any other suitable manner. By employing a robust algorithm, the corresponding uncertainties for magnetic field measurements may vary widely yet still be accommodated and provide useful information. In contrast, prior art approaches conventionally rely on simply rejecting this information and no benefit is obtained from it. The following discussion is provided in the contexts of implementing a maximum likelihood type estimate ("an M-estimate") to derive a location and a scale of the probability density function of magnetic field measurements in the presence of erroneous measurements, but it should be recognized that one of ordinary skill in the art can utilize alternative implementations that are within the scope of this disclosure to achieve the same goals, such as order statistics or rank-based tests. In this example, the probability density function parameters may be estimated separately for the X, Y, and Z components of the magnetic vector. However, this algorithm can be generalized for estimation of cross correlations as well. As such, the discussion below relates to the determination of a location and a scale for the X component of a magnetic field and it should be recognized that the Y and Z components may be found using similar approaches.

Because the magnetic field measurement for each position may exhibit different uncertainties, the location parameter t may be found by minimizing Equation (6):

$$\bar{v}^x = \operatorname*{argmin}_{\bar{v}^x} \sum_{i=1}^{n} \gamma\left(\frac{v_i^x - \bar{v}^x}{\sigma_i^x}\right)$$

Equation (6) is written for the X component of the magnetic field, in which $v_i^x$, $i=1, \ldots, n$ are the measurements of the X component of the magnetic field for each position, n is the number of measurements for that position, $\sigma_i^x = (S_i(1,1))^{1/2}$, $i=1, \ldots, n$ are standard deviations of the X component of magnetic field measurements $v_i^x$ for that position, and $\gamma$ is a nonlinear function. As will be appreciated, this equation accommodates conditions in which the magnetic field measurements $v_i^x$, $i=1, \ldots, n$ have different standard deviations $\sigma_i^x$, $i=1, \ldots, n$. Using uncertainties $\sigma_i^x$ of every measurement and the nonlinear function $\gamma$ allows to correctly take all measurements into account and mitigate effect from contaminating measurements.

Taking the derivation of Equation (6) results in equivalent condition to find $\bar{v}^x$ given by Equation (7), in which function $\rho$ is the derivative of $\gamma$:

$$\sum_{i=1}^{n} \frac{1}{\sigma_i^x} \rho\left(\frac{v_i^x - \bar{v}^x}{\sigma_i^x}\right) = 0$$

Depending on the embodiment, examples of suitable nonlinear functions p that may be employed to provide estimation of a location parameter in presence of erroneous measurements include Huber's, "biweight" Tukey's, Humpel's, Andrews' and other similar functions that are described in publications, e.g. Huber P. "Robust Statistics", 2004, John Wiley & Sons.

Figure 6:
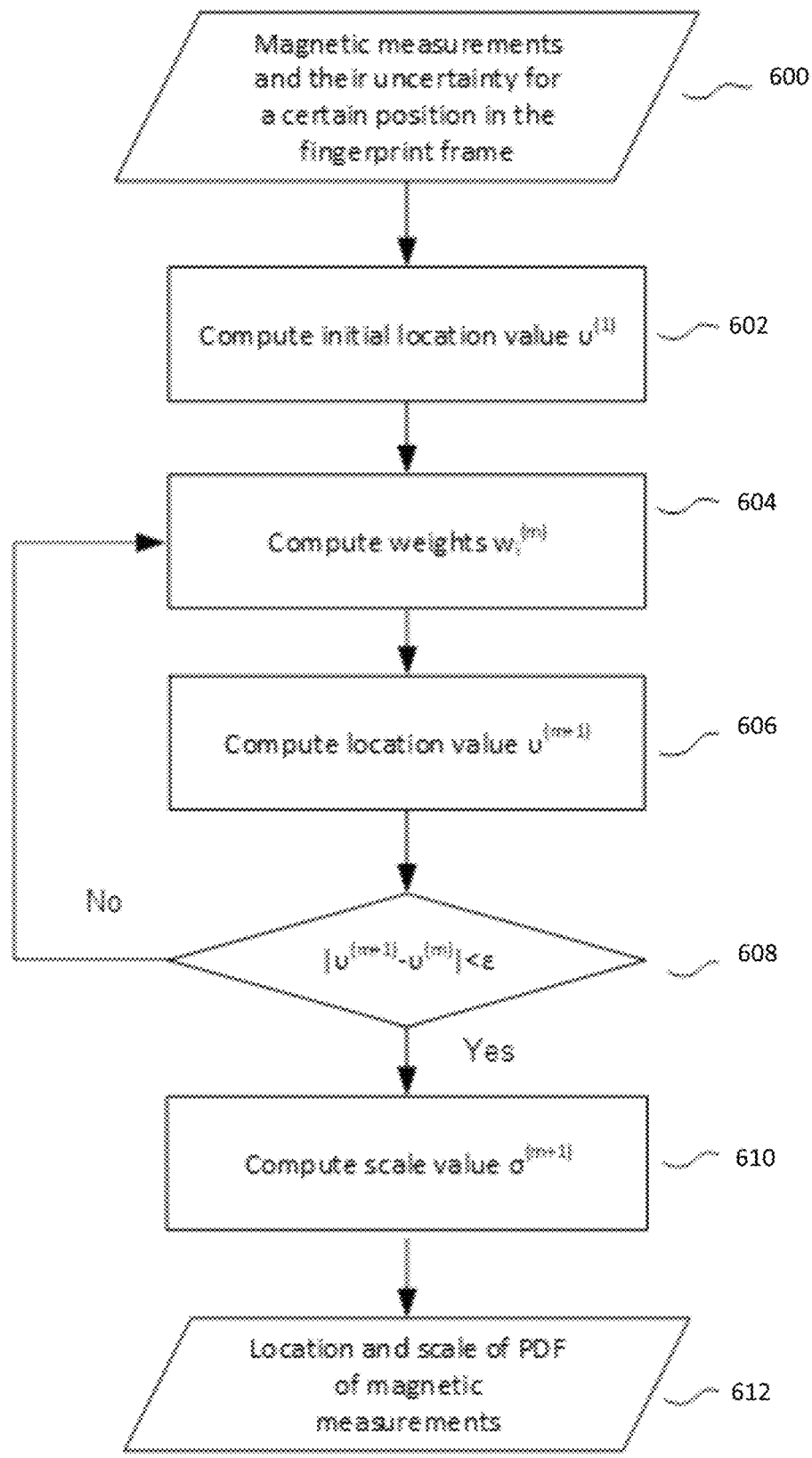
FIG. 6 is a flowchart showing a routine for determining parameters of a probability density function of magnetic field measurements by accommodating erroneous data according to an embodiment.

Likewise, different approaches for solving Equation (7) may be used, including an iterative technique exemplified by the flowchart depicted in FIG. 6 for implementing a robust algorithm for determining probability density function parameters. The inputs received in 600 are the magnetic field measurements and their uncertainties as expressed in the fingerprint frame according to the above discussion. An initial value for a location parameter $(\bar{v}^x)^{(1)}$ may be computed in 602, for example as a median of the magnetic field measurements according to Equation (8):

$$(\bar{v}^x)^{(1)} = \operatorname{med}(v_1^x, \ldots, v_n^x),$$

For each iteration m, a weight of the magnetic measurement may be derived in 604 using Equation (9):

$$w_i^{(m)} = \frac{\frac{1}{(\sigma_i^x)^2} \rho\left(\frac{v_i^x - (\bar{v}^x)^{(m)}}{\sigma_i^x}\right)}{\frac{v_i^x - (\bar{v}^x)^{(m)}}{\sigma_i^x}}, i = 1, \ldots, n$$

Using the weight determined for this iteration, the next iterative value of the location parameter $\bar{v}^x$ may be computed in 606 according to Equation (10):

$$(\bar{v}^x)^{(m+1)} = \frac{\sum_{i=1}^{n} w_i^{(m)} v_i^x}{\sum_{i=1}^{n} w_i^{(m)}}$$

The routine may loop as indicated from 604 and 606 until a suitable condition is met, such as the difference between successive iterations falling below a desired threshold, as tested in 608. Specifically, if the difference $|(\bar{v}^x)^{(m+1)} - (\bar{v}^x)^{(m)}|$ is greater than $\varepsilon$, the routine returns to 604 for another iteration and m is incremented. When the difference is below the threshold (or another suitable condition is met), the route continues to 610 so that the scale parameter may be calculated according to Equation (11):

$$\sigma^x = \left(\frac{\sum_{i=1}^{n} w_i^{(m)} (v_i^x - (\bar{v}^x)^{(m+1)})^2}{\sum_{i=1}^{n} w_i^{(m)}}\right)^{1/2}$$

Thus, the outputs 612 of FIG. 6 are the location $(\bar{v}^x)^{(m+1)}$ and the scale $\sigma^x$ of the X magnetic component and the location and scale of the other components of the magnetic field, Y and Z, may be estimated similarly using $v_i^y$ and $\sigma_i^y = (S_i(2,2))^{1/2}$ for Y component and $v_i^z$ and $\sigma_i^z = (S_i(3,3))^{1/2}$ for Z component correspondingly, $i=1, \ldots, n$.

Figure 2:
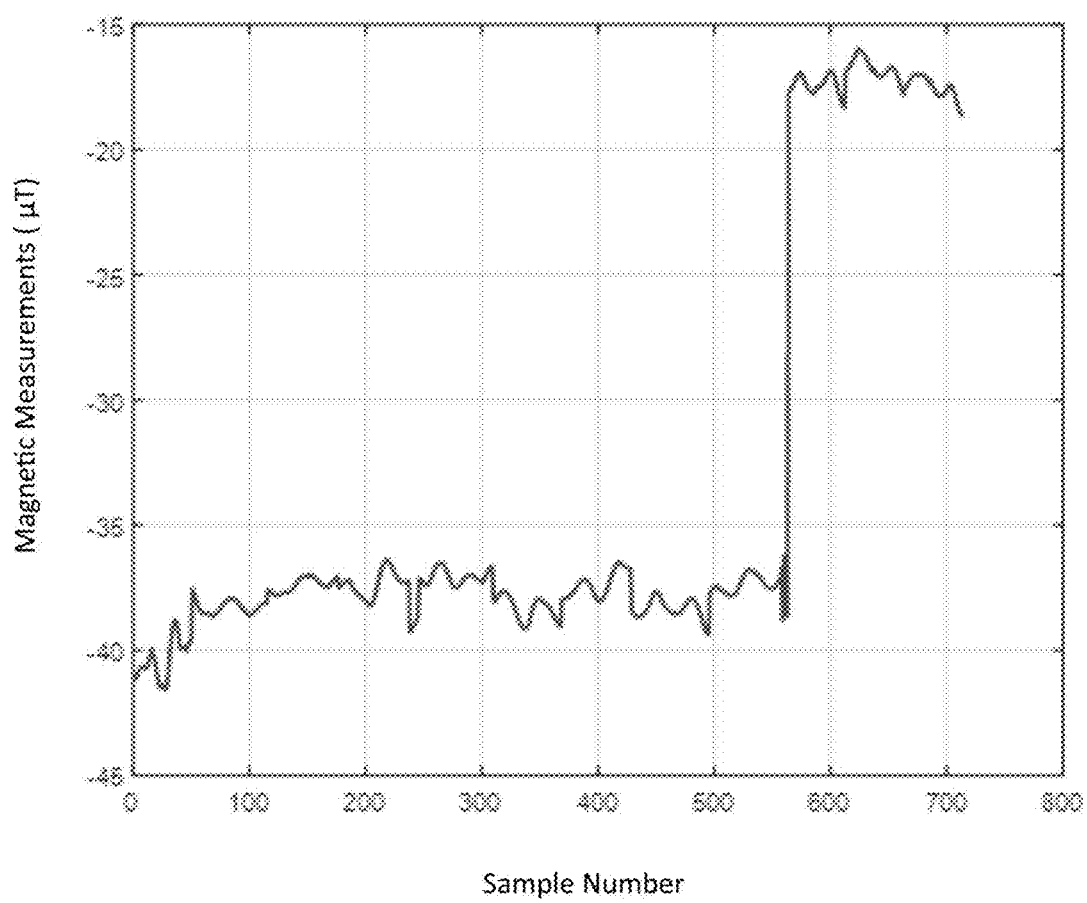
FIG. 2 is a graphical representation of magnetic field measurements having erroneous data obtained from a plurality of portable devices, according to an embodiment.
Figure 3:
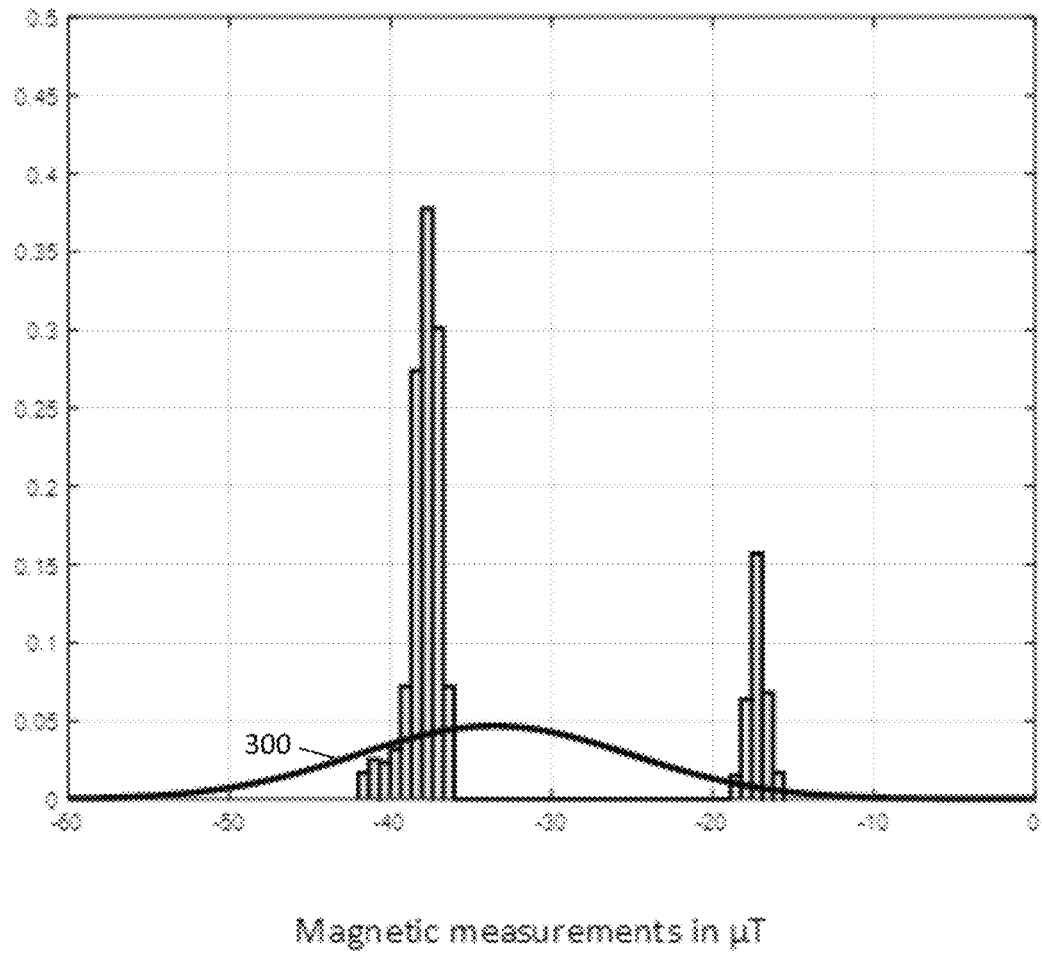
FIG. 3 is a graphical representation of a histogram showing the estimation of the magnetic field measurements of FIG. 2 according to a conventional averaging technique.
Figure 7:
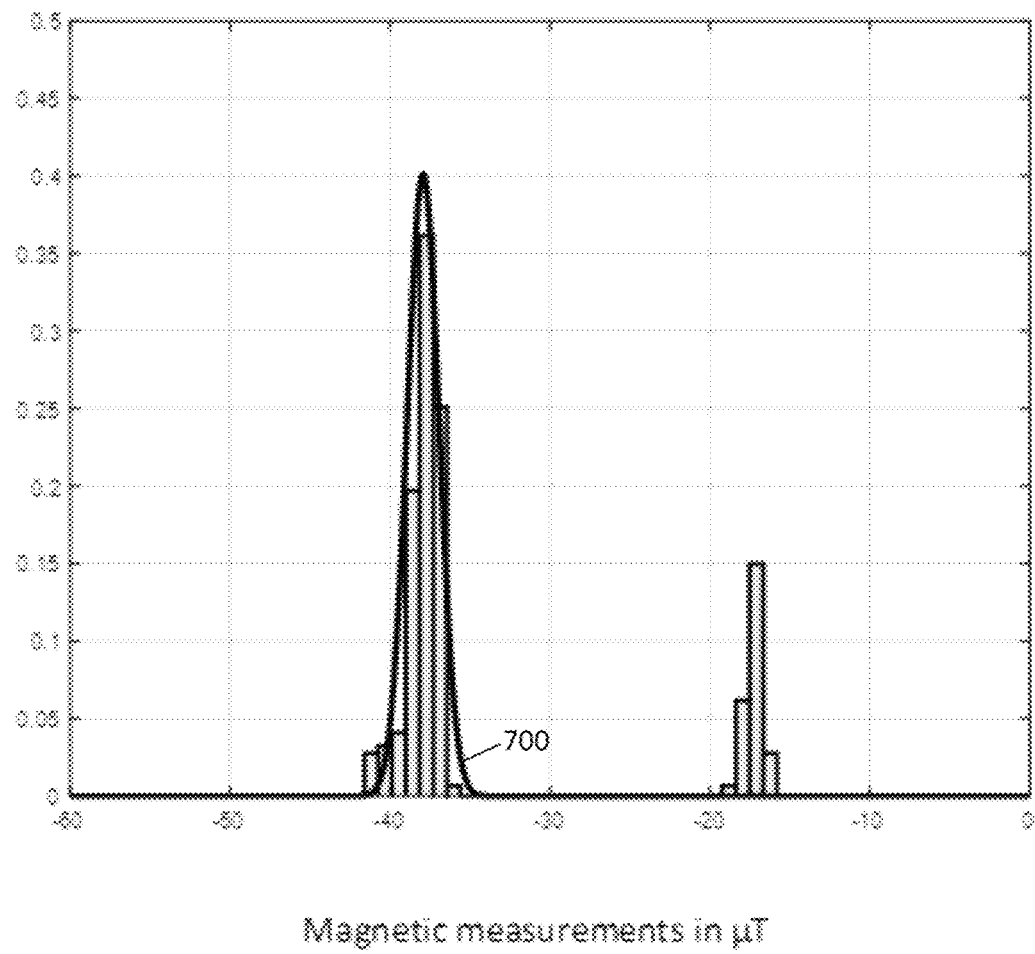
FIG. 7 is a graphical representation of a histogram showing the estimation of the magnetic field measurements of FIG. 2 by determining parameters of a probability density function of magnetic field measurements by accommodating erroneous data according to an embodiment.

To help illustrate the benefits of Applicant's techniques, FIG. 7 schematically depicts a histogram of the same data considered in FIGS. 2 and 3. As described above, the data reflects measurements of the magnetic field along the Z-axis as collected from multiple users, each with associated portable devices for a given location, with some erroneous measurements that result from being taken at an incorrect position. Following application of the robust algorithm for determining parameters of the probability density function of this data, the magnetic field estimation is depicted by curve 700, with the location and scale determined as discussed above using Tukey's function $\rho$ in equations above. As will be appreciated, the influence of the erroneous measurements (those between approximately −20 and −15 μT) has effectively been reduced or omitted. Correspondingly, curve 700 closely and accurately tracks the obtained measurements that were correct (those between approximately −40 and −35 μT). This improvement is visually represented by the close correspondence in the peak of curve 700 and the histogram, as compared to FIG. 3 in which curve 300 was shifted. Likewise, the breadth of curve 700 is substantially reduced as compared to curve 300, indicating a reduced variance and consequently a more certain measurement to be associated with the position when constructing the fingerprint map.

Figure 8:
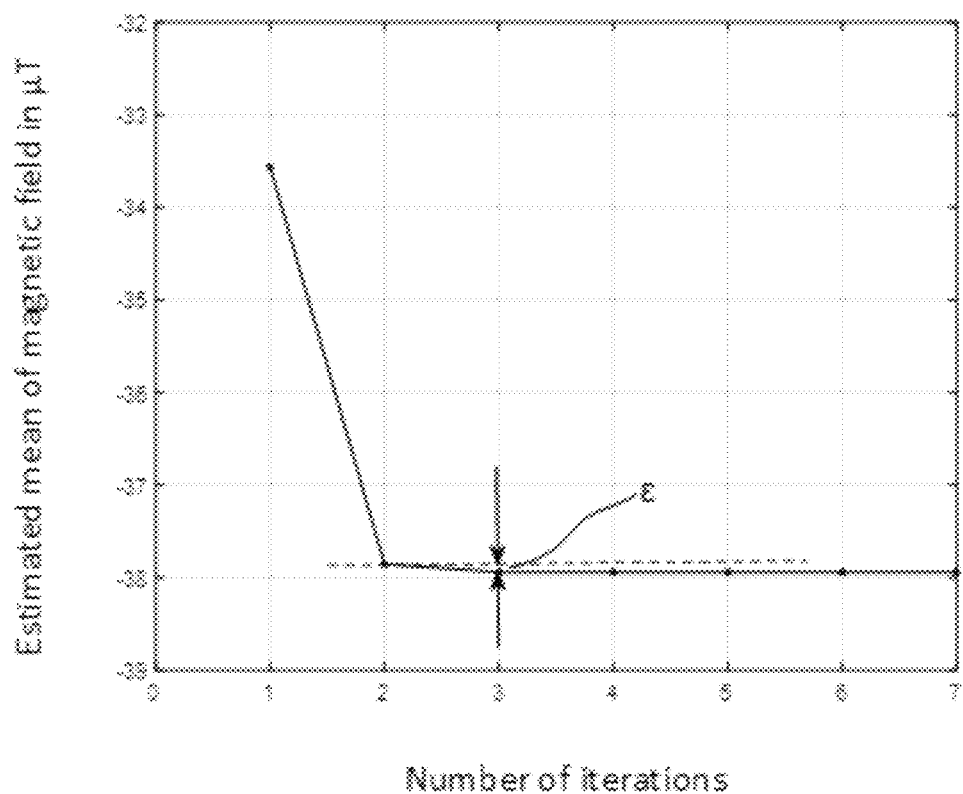
FIG. 8 is a graphical representation that indicates convergence of an iteration procedure for determining parameters of a probability density function according to an embodiment.

FIG. 8 is a schematic illustration of convergence of the iteration procedure. As shown, the estimated mean (location) of the Z component of magnetic field is plotted against the number of iterations performed. An initial value for the iterations was set as the average value of magnetometer measurements. It can be seen that iteration process converges very rapidly and after only three iterations, the estimated mean is almost constant. The parameter ε shown in the figure indicates a condition, that when satisfied, may indicate sufficient iterations have been performed.

Thus, from the above materials it will be appreciated that a method for generating a magnetic fingerprint map includes obtaining information representing orientation and position and sensor data comprising magnetic field measurements for each of a plurality of portable devices. A position and orientation is determined for each portable device based at least in part on the information representing orientation and position. Magnetic field measurements from each portable device are correlated with each determined position. Uncertainties associated with the magnetic field measurements are estimated and the magnetic field measurements and associated uncertainties are converted from a device frame to a unified fingerprint frame, based at least in part on the determined orientations. Parameters of a probability distribution function for magnetic field measurements at each determined position are determined based at least in part on the converted magnetic field measurements and associated uncertainties and the magnetic fingerprint map is generated using the determined parameters of the probability distribution functions for magnetic field measurements at each determined position.

It will also be appreciated that the above descriptions regarding exemplary procedures for building magnetic fingerprint maps may be utilized in different ways. For example, a magnetic fingerprint database can be updated every time a sufficient amount of new magnetic field measurements and/or other sensor data becomes available, either as a result of a crowdsourced activity or after an additional systematic survey. Correspondingly, all data collected, including the new portion of data as well as the existing data, may be used for a magnetic fingerprint update.

As a further illustrations, another variant is to build a magnetic fingerprint map using only the more recent collected data and then compare the new fingerprint and with the previous one. If there are no significant differences between them (such as, in terms of parameters of the probability distribution functions for magnetic field measurements), then the magnetic fingerprint map may be updated using all available data with the aim to achieve better accuracy of the fingerprint map. In contrast, if the new and previous fingerprints significantly differ for one or more locations this means, this may be taken as an indication of a change in the magnetic fields of the in indoor environment in these locations, which in turn affected the measurements and making it more likely the previous fingerprint map is no longer as accurate as desired in the affected locations. Under these conditions, any new information may be used to substitute the previous information, including by using the latest parameters of the probability density function as derived according to the techniques of this disclosure.

In one aspect, the uncertainties associated with the magnetic field measurements may be an orientation uncertainty for each determined orientation. The orientation uncertainties may be angular orientation variances.

In one aspect, the uncertainties associated with the magnetic field measurements may be magnetic field measurement uncertainties. The magnetic field measurement uncertainties may be position uncertainties. The position uncertainties may be based at least in part on a desired granularity of the magnetic fingerprint map.

In one aspect, a magnetometer for each portable device may be calibrated to determine a magnetic bias and a magnetic bias uncertainty may be estimated for each portable device, such that the uncertainties associated with the magnetic field measurements may include the magnetic bias uncertainties. The magnetic bias uncertainties may be covariance matrices.

In one aspect, the parameters of the probability distribution functions for magnetic field measurements may be location and scale parameters. The location parameters may be derived by a minimization function based at least in part on the magnetic field measurements and a standard deviation for each magnetic field measurement in the fingerprint frame. The scale parameters may be based at least in part on weights of the magnetic field measurements and deviations of magnetic field measurements from the location parameter.

In one aspect, the parameters of the probability distribution functions for magnetic field measurements may be determined by a maximum likelihood type estimation, by order statistics, and/or by a rank-based test.

In one aspect, the magnetic field measurements may be filtered using a movement condition before determining parameters of the probability distribution function.

In one aspect, at least one of the portable devices may be piloted autonomously.

In one aspect, at least one of the portable devices may be associated with a user.

In one aspect, additional magnetic field measurements may be received at a subsequent time, so that the magnetic fingerprint map is updated by updating the parameters of the probability distribution function using the additional magnetic field measurements together with existing information.

In one aspect, additional magnetic field measurements may be received at a subsequent time, so that parameters of a probability distribution function for the additional magnetic field measurements are determined and the magnetic fingerprint map is updated by substituting the parameters of the probability distribution function for the additional magnetic field measurements for existing information. Substituting the parameters of the probability distribution function for the additional magnetic field measurements may be based at least in part on a comparison of existing information and information corresponding to the additional magnetic field measurements.

As also indicated in the above materials, a system for generating a magnetic fingerprint map may include a plurality of portable devices and remote processing resources. Each portable device provides information representing position and orientation of that portable device and wherein each portable device provides sensor data comprising magnetic field measurements. The remote processing resources may be configured to receive the information and sensor data from each portable device and to implement a fingerprinting mapping module to determine parameters of a probability distribution function for magnetic field measurements at each of multiple determined positions based at least in part on converted magnetic field measurements and associated uncertainties. A position and orientation of each portable device is determined based at least in part on the information. Magnetic field measurements are correlated with each determined position for each portable device, such that multiple magnetic field measurements are correlated with multiple determined positions. Uncertainties associated with the magnetic field measurements are estimated, so that the magnetic field measurements and associated uncertainties are converted from a device frame to a unified fingerprint frame, based at least in part on the determined orientations. The fingerprinting mapping module then may generate a magnetic fingerprint map, based at least in part on the determined parameters of the probability distribution functions for magnetic field measurements at the multiple determined positions.

In one aspect, each portable device has a sensor assembly comprising at least one inertial sensor and wherein the information representing position and orientation of the portable device is based at least in part on data from the sensor assembly.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for generating a magnetic fingerprint map, the method comprising:
   a) for a plurality of portable devices, obtaining information representing orientation and position of each portable device;
   b) obtaining sensor data for each portable device comprising magnetic field measurements, wherein each portable device includes an integrated magnetometer;
   c) determining a position and orientation for each portable device, based at least in part on the information representing orientation and position for each portable device;
   d) correlating the magnetic field measurements from each portable device with the determined position of each portable device;
   e) estimating uncertainties associated with the magnetic field measurements;
   f) converting the magnetic field measurements and the associated uncertainties from a device frame to a unified fingerprint frame, based at least in part on the determined orientations;
   g) determining parameters of a probability distribution function for the magnetic field measurements and mitigating contaminating measurements at each determined position based at least in part on the converted magnetic field measurements and the associated uncertainties; and
   h) generating a magnetic fingerprint map, wherein the magnetic fingerprint map includes the determined position of each portable device correlated with the magnetic field measurement.

2. The method of claim 1, wherein the uncertainties associated with the magnetic field measurements comprise an orientation uncertainty for each determined orientation.

3. The method of claim 2, wherein the orientation uncertainties comprise angular orientation variances.

4. The method of claim 1, wherein the uncertainties associated with the magnetic field measurements comprise magnetic field measurement uncertainties.

5. The method of claim 4, wherein the magnetic field measurement uncertainties comprise position uncertainties.

6. The method of claim 5, wherein the position uncertainties are based at least in part on a desired granularity of the magnetic fingerprint map.

7. The method of claim 1, further comprising calibrating a magnetometer for each portable device to determine a magnetic bias and estimating a magnetic bias uncertainty for each portable device, wherein the uncertainties associated with the magnetic field measurements comprise the magnetic bias uncertainties.

8. The method of claim 7, wherein the magnetic bias uncertainties comprises covariance matrices.

9. The method of claim 1, wherein the parameters of the probability distribution functions for magnetic field measurements comprise location and scale parameters.

10. The method of claim 9, wherein the location parameters are derived by a minimization function based at least in part on the magnetic field measurements and a standard deviation for each magnetic field measurement in the fingerprint frame.

11. The method of claim 9, wherein the scale parameters are based at least in part on weights of the magnetic field measurements and deviations of magnetic field measurements from the location parameter.

12. The method of claim 1, further comprising filtering the magnetic field measurements using a movement condition before determining parameters of the probability distribution function.

13. The method of claim 1, wherein at least one of the portable devices is piloted autonomously.

14. The method of claim 1, wherein at least one of the portable devices is associated with a user.

15. The method of claim 1, further comprising receiving additional magnetic field measurements at a subsequent time and updating the magnetic fingerprint map by updating the parameters of the probability distribution function using the additional magnetic field measurements together with existing information.

16. The method of claim 1, further comprising receiving additional magnetic field measurements at a subsequent time, determining parameters of a probability distribution function for the additional magnetic field measurements and updating the magnetic fingerprint map by substituting the parameters of the probability distribution function for the additional magnetic field measurements for existing information.

17. The method of claim 16, wherein substituting the parameters of the probability distribution function for the additional magnetic field measurements is based at least in part on a comparison of existing information and information corresponding to the additional magnetic field measurements.

18. A system for generating a magnetic fingerprint map comprising:
   a plurality of portable devices, wherein each portable device provides information representing position and orientation of each portable device and wherein each portable device provides sensor data comprising magnetic field measurements obtained from an integrated magnetometer of each portable device; and
   remote processing resources configured to receive the information and sensor data from each portable device and to implement a fingerprint mapping module to:
      a) determine parameters of a probability distribution function for magnetic field measurements and mitigate contaminating measurements at each determined position based at least in part on converted magnetic field measurements and associated uncertainties, wherein:

i) a position and orientation of each portable device is determined based at least in part on the information;

ii) the magnetic field measurements are correlated with each determined position for each portable device;

iii) the uncertainties associated with the magnetic field measurements are estimated; and iv) the magnetic field measurements and the associated uncertainties are converted from a device frame to a unified fingerprint frame, based at least in part on the determined orientations; and b) generate a magnetic fingerprint map, wherein the magnetic fingerprint map includes the determined position of each portable device correlated with the magnetic field measurements.

19. The system of claim 18, wherein each portable device has a sensor assembly comprising at least one inertial sensor and wherein the information representing position and orientation of the portable device is based at least in part on data from the sensor assembly.

20. A server for generating a magnetic fingerprint map having a processor configured to implement a fingerprint mapping module to:

a) determine parameters of a probability distribution function for magnetic field measurements at each of multiple determined positions and mitigate contaminating measurements based at least in part on converted correlated magnetic field measurements and converted magnetic field measurement uncertainties, wherein the magnetic field measurements are obtained from a plurality of portable devices each having an integrated magnetometer and wherein each portable device provides information representing position and orientation of each portable device, wherein:

i) a position and orientation of each portable device is determined based at least in part on the information;

ii) the magnetic field measurements are correlated with each determined position for each portable device;

iii) uncertainties associated with the magnetic field measurements are estimated; and iv) the magnetic field measurements and the associated uncertainties are converted from a device frame to a unified fingerprint frame, based at least in part on the determined orientations; and b) generate a magnetic fingerprint map, based at least in part on wherein the magnetic fingerprint map includes the determined position of each portable device correlated with the magnetic field measurements.

\* \* \* \* \*